United States Patent
Zhang et al.

(10) Patent No.: US 11,177,438 B2
(45) Date of Patent: Nov. 16, 2021

(54) PATTERNING OXIDATION RESISTANT ELECTRODE IN CROSSBAR ARRAY CIRCUITS

(71) Applicant: TETRAMEM INC., Newark, CA (US)

(72) Inventors: Minxian Zhang, Newark, CA (US); Ning Ge, Newark, CA (US)

(73) Assignee: Tetramen Inc., Newark, CA (US)

( * ) Notice: Subject to any disclaimer, the term of this patent is extended or adjusted under 35 U.S.C. 154(b) by 0 days.

(21) Appl. No.: 16/421,166

(22) Filed: May 23, 2019

(65) Prior Publication Data

US 2020/0373486 A1 Nov. 26, 2020

(51) Int. Cl.
*H01L 45/00* (2006.01)
*H01L 27/24* (2006.01)

(52) U.S. Cl.
CPC ...... *H01L 45/1675* (2013.01); *H01L 27/2463* (2013.01); *H01L 45/1253* (2013.01); *H01L 45/146* (2013.01); *H01L 45/1616* (2013.01); *H01L 45/1633* (2013.01)

(58) Field of Classification Search
CPC ............. H01L 45/1633; H01L 45/1675; H01L 27/2463; H01L 45/1616; H01L 45/146; H01L 45/1253; H01L 45/08; H01L 45/1233; H01L 45/16
See application file for complete search history.

(56) References Cited

U.S. PATENT DOCUMENTS

| | | | | |
|---|---|---|---|---|
| 5,515,984 | A * | 5/1996 | Yokoyama | C23F 4/00 216/41 |
| 6,169,009 | B1 * | 1/2001 | Ju | C23F 4/00 438/396 |
| 2003/0059720 | A1 * | 3/2003 | Hwang | C23F 4/00 430/311 |
| 2006/0273877 | A1 * | 12/2006 | Kanno | G11C 13/0007 338/174 |
| 2013/0112935 | A1 * | 5/2013 | Himeno | H01L 45/16 257/4 |
| 2015/0270140 | A1 * | 9/2015 | Gupta | H01L 21/32136 216/67 |
| 2017/0141160 | A1 * | 5/2017 | Zhang | H01L 27/0248 |
| 2019/0036020 | A1 * | 1/2019 | Majhi | H01L 45/1233 |

* cited by examiner

*Primary Examiner* — Benjamin Tzu-Hung Liu
(74) *Attorney, Agent, or Firm* — MagStone Law LLP (57) ABSTRACT

An example method includes: forming a bottom electrode on a substrate and forming a patterned mask layer on the bottom electrode; thermal oxidizing the bottom electrode layer via the patterned mask layer by applying a thermal process and a first plasma; removing a gaseous status of the bottom electrode oxide using a first vacuum purge; removing a solid status of the bottom electrode oxide by applying a second plasma; removing the gaseous status and the solid status of the bottom electrode oxide using a second vacuum purge to form a patterned bottom electrode; removing the patterned mask layer; forming a filament forming layer on the patterned bottom electrode; and a top electrode on the filament forming layer. The filament forming layer is configured to form a filament within the filament forming layer responsive to a switching voltage being applied to the filament forming layer.

14 Claims, 9 Drawing Sheets

| Solid Oxide Phase in equilibrium with metal and one atmosphere of oxygen at room temperature | Dissociation Temperature at 1 atm of oxygen | Gaseous Phases |
|---|---|---|
| PtO₂ | 280-450°C (3) | PtO₂ |
| RhO₂ | 1400°C (4) | RhO₂ |
| IrO₂ | 1120°C (5) | IrO₂ (6) |
| RuO₂ | 1540°C (2) | RuO₄ (2) (predominates slightly at lower temperatures) |
|  |  | RuO₃ (3) (predominates at higher temperatures) |
| OsO₂ | 650°C (4) | OsO₄ (4) |
|  |  | OsO₃ (4) |

| | Pd | Pt |
|---|---|---|
| Atomic number | 46 | 78 |
| Density, g/cc | 12.02 | 21.45 |
| Melting point, °C | 1555 | 1768 |
| Crystal structure | FCC | FCC |

PATTERNING OXIDATION RESISTANT ELECTRODE IN CROSSBAR ARRAY CIRCUITS

TECHNICAL FIELD

The present disclosure generally relates to crossbar array circuits with Resistive Random-Access Memory (RRAM) and more specifically to patterning oxidation resistant electrodes in crossbar array circuits.

BACKGROUND

Traditionally, a crossbar array circuit may include horizontal metal wire rows and vertical metal wire columns (or other electrodes) intersecting with each other, with crossbar devices formed at the intersecting points. A crossbar array may be used in non-volatile solid-state memory, signal processing, control systems, high-speed image processing systems, neural network systems, and so on.

A RRAM is a two-terminal passive device capable of changing resistance responsive to sufficient electrical stimulations, which have attracted significant attention for high-performance non-volatile memory applications. The resistance of a RRAM may be electrically switched between two states: a High-Resistance State (HRS) and a Low-Resistance State (LRS). The switching event from a HRS to a LRS is often referred to as a "Set" or "On" switch; the switching systems from a LRS to a HRS is often referred to as a "Reset" or "Off" switching process.

A filament may form during a switching process. The manners in which oxygen migration in a filament may affect how a filament forms. Controlling the manner in which oxygen migrates in a filament therefore provides indirect control over a switching process and the electrical behaviors of a RRAM.

SUMMARY

Technologies relating to providing oxidation resistant electrodes in RRAM-based crossbar array circuits and patterning oxidation resistant electrodes are disclosed.

A method of manufacturing an RRAM-based crossbar array circuit, in some implementations, includes: providing a substrate; forming a bottom electrode layer on the substrate; forming a patterned mask layer on the bottom electrode layer; thermal oxidizing the exposed bottom electrode layer via the patterned mask layer by applying a thermal process and a first plasma; removing a gaseous status of the bottom electrode oxide by a first vacuum purge; removing a solid status of the bottom electrode oxide by applying a second plasma; removing the gaseous status of the bottom electrode oxide and the solid status of the bottom electrode oxide by a second vacuum purge to form a patterned bottom electrode; removing the patterned mask layer; forming a filament forming layer on the patterned bottom electrode; and forming a top electrode on the filament forming layer, wherein the filament forming layer is configured to form a filament within the filament forming layer when applying a switching voltage upon the filament forming layer.

The first plasma, in some implementations, includes an oxygen plasma. The second plasma, in some implementations, includes an argon plasma.

In some implementations, the thermal process includes heating under a temperature between 350° C. and 450° C.

In some implementations, the substrate is made of a material selected from Si, $SiO_2$, $Si_3N_4$, $Al_2O_3$, AlN, or glass.

The patterned bottom electrode is, in some implementations, made of an oxidation resistance conductive material comprising Pt, Pd, Ir, a combination thereof, or an alloy or other conductive materials thereof.

In some implementations, a material of the patterned bottom electrode includes a Ti/Pt, Ti/Pd, or Ti/(Pt, Pd) layer.

In some implementations, a thickness of the patterned bottom electrode is 10-30 nanometers.

The top electrode, in some implementations, includes Pd, Pt, Ir, W, Ta, Hf, Nb, V, Ti, TiN, TaN, NbN, a combination thereof, or an alloy with other conductive materials thereof.

The filament forming layer, in some implementations, includes $TaO_x$ (where $x \leq 2.5$), $HfO_x$ (where $x \leq 2$), $TiO_x$ (where $x \leq 2$), $ZrO_x$ (where $x \leq 2$) or a combination thereof.

The method, in some implementations, further includes: forming a thermal oxide layer or inter-layer dielectric layer on the substrate before forming the bottom electrode layer on the substrate; a material of the thermal oxide layer comprises $SiO_2$.

In some implementations, forming a patterned mask layer on the bottom electrode layer includes: forming a mask layer on the bottom electrode layer; forming a photo resist layer on the mask layer; patterning the photo resist layer to produce a patterned photo resist layer; etching the mask layer by ion-etching or reactive-ion etching via the patterned photo resist layer to form the patterned mask layer; and removing the patterned photo resist layer.

In some implementations, the mask layer is made of $SiO_2$.

In some implementations, a density of the mask layer may be lower than that of the thermal oxide layer.

The method, in some implementations, further includes: connecting the pattern bottom electrode to a first row wire; and connecting the top electrode to a first column wire.

BRIEF DESCRIPTION OF THE DRAWINGS

The implementations disclosed herein are illustrated by way of example, and not by way of limitation, in the figures of the accompanying drawings. Like reference numerals refer to corresponding parts throughout the drawings.

DETAILED DESCRIPTION

Technologies relating to providing one or more oxidation resistant electrodes in RRAM-based crossbar array circuits and patterning oxidation resistant electrode are disclosed.

The technologies described in the present disclosure may provide the following technical advantages.

First, the disclosed technology identifies more desirable materials for making an RRAM electrode that is oxidation resistant which offers a better control over oxygen vacancy migration while a RRAM is being programming.

Second, materials that are good candidates for making RRAM electrode might be technically challenging to pattern, due to their potentially high chemical inertness (which resists wet etching) or potentially greater inclination to produce non-gaseous reaction product (which resists dry etching). The present disclosure provides methods for patterning some of these materials.

Third, technologies disclosed in the present disclosure may provide a clean surface for an oxidation resistant electrode and thus increase contact stability between the electrode and the RRAM oxide, a high desirable result.

Figure 1A:
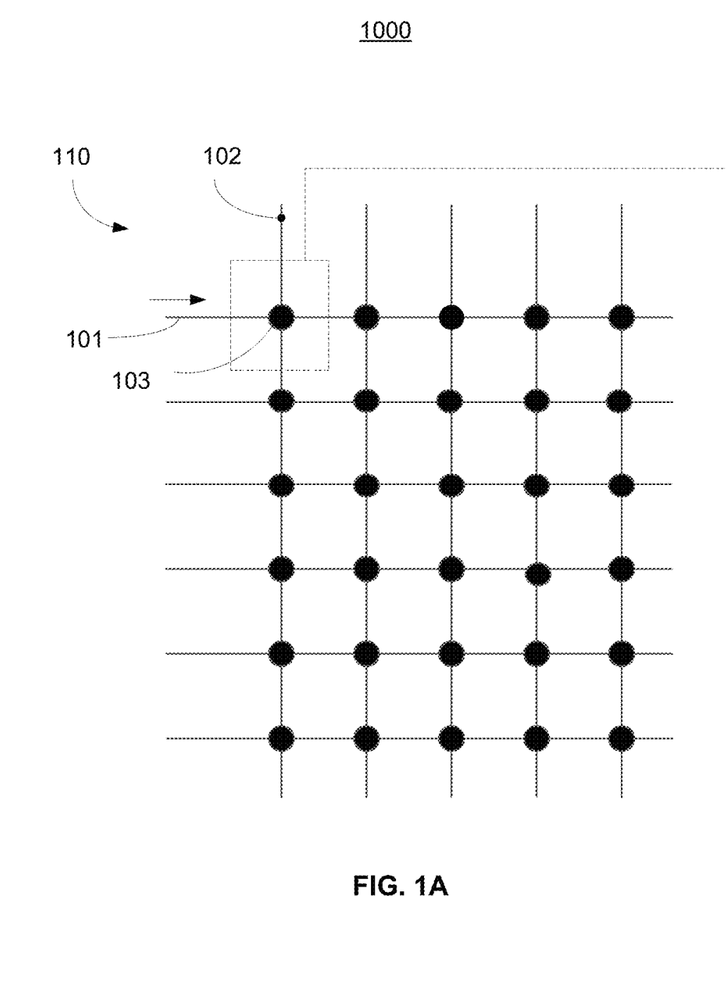
FIG. 1A is a block diagram illustrating an example crossbar array circuit in accordance with some implementations of the present disclosure.

FIG. 1A is a block diagram 1000 illustrating an example crossbar array circuit 110 in accordance with some implementations of the present disclosure. As shown in FIG. 1A, the crossbar array circuit 110 includes a first row wire 101, a first column wire 102, and a cross-point device 103.

Figure 1B:
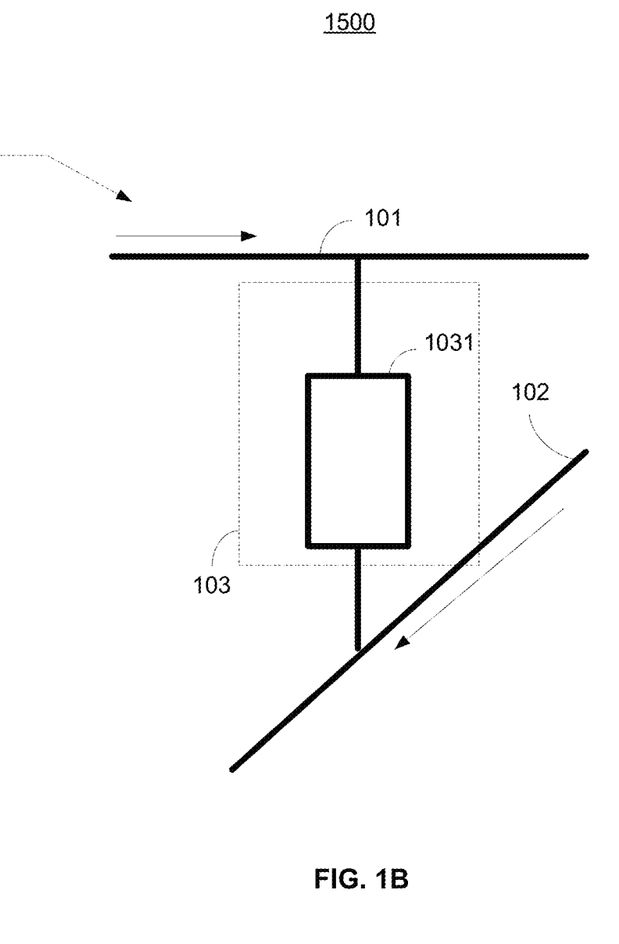
FIG. 1B is a block diagram illustrating a partially enlarged view of an example crossbar device in accordance with some implementations of the present disclosure.

FIG. 1B is a block diagram 1500 illustrating a partially enlarged view of the example cross-point device 103 shown in FIG. 1A in accordance with some implementations. In FIG. 1B, the cross-point device 103 connects the first row wire 101 with the first column wire 102 of the crossbar array circuit 110 shown in FIG. 1A. The cross-point device 103 includes an RRAM stack 1031.

As explained above, the effectiveness of and the degree of control over a RRAM stack may be determined in accordance with how a filament in the RRAM stack is set, reset, or both.

If an electrode in a RRAM stack contributes to oxygen migration in a filament while the filament is being formed, the complexity of controlling oxygen vacancy migration during a programming may increase. Therefore, in some implementations, an oxidation resistant electrode is introduced to reduce the movement of the oxygen (or oxygen ions) in and out of the electrode and to provide better oxygen vacancy migration control within the switching oxide.

An oxidation resistant electrode, however, may be technically difficult to pattern (or etch) due to its potentially high chemical inertness (which resists wet etching) or greater likelihood of producing non-gaseous reaction product (which resists dry etching). The present disclosure provides various methods for patterning an oxidation resistant electrode to enhance contact stability between the electrode and a RRAM oxide and maintain a RRAM cell's excellent electrical characteristics.

FIGS. 2A-2J are block diagrams illustrating an example process for manufacturing a RRAM stack (for example, the RRAM stack 1031) in accordance with some implementations of the present disclosure.

Figure 2A:
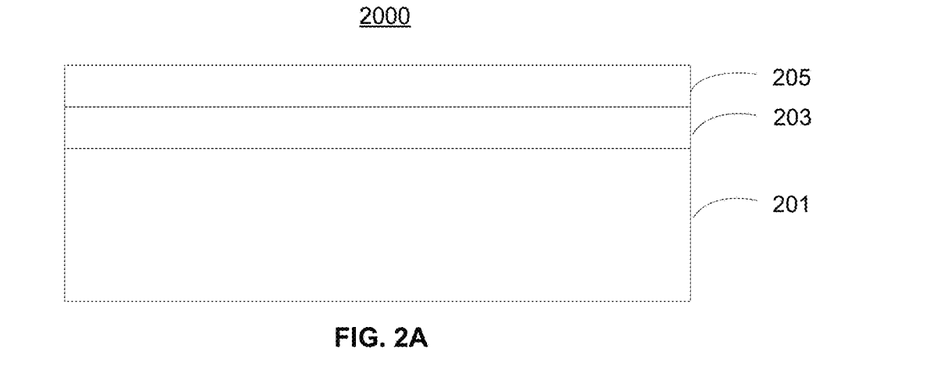
FIGS. 2A-2J are block diagrams illustrating an example process for manufacturing a RRAM stack in accordance with some implementations of the present disclosure.
Figure 2B:
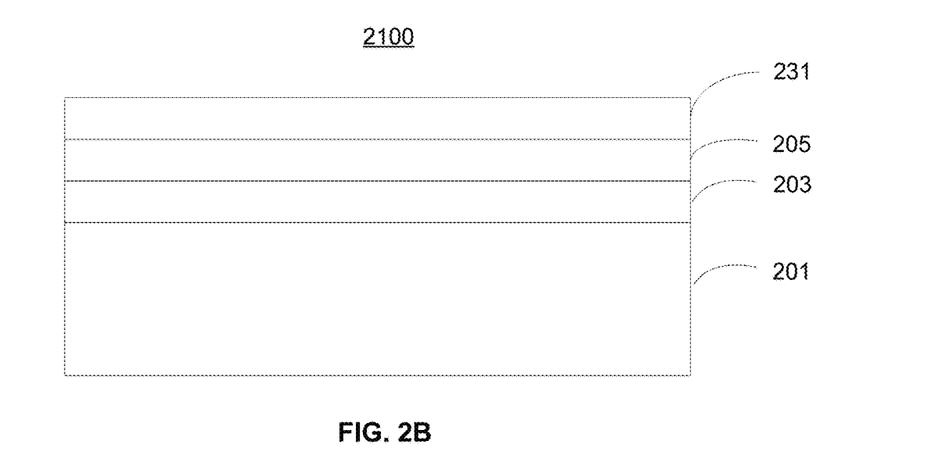
Figure 2C:
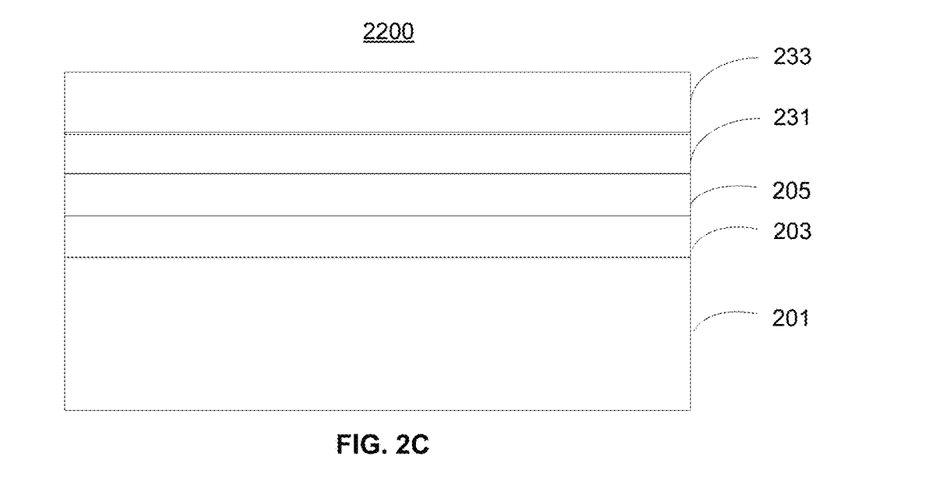

As shown in FIG. 2A, a thermal oxide layer or inter-dielectric layer 203 is formed on a substrate 201, and a bottom electrode layer 205 is formed on the thermal oxide layer 203. Next, as shown in FIG. 2B, a mask layer 231 is formed on the bottom electrode layer 205; and, as shown in FIG. 2C, a photo resistant layer 233 is formed on the mask layer 231.

The substrate 201 is, in some implementations, made of a material selected from one of: Si, $SiO_2$, $Si_3N_4$, $Al_2O_3$, AlN, and glass. The substrate 201, in some implementations, includes one or more doped regions: one or more p-doped regions and one or more n-doped regions. In some implementations, the substrate 201 is a workpiece that supports various layers formed within the substrate 201, over the substrate 201, or attached to the substrate 201.

The inter-dielectric layer or thermal oxide layer 203, in some implementations, includes $SiO_2$. It is noted that the thermal oxide layer may also be referred to as a high temperature oxide layer, which means that a thermal oxidation of the thermal oxide layer 203 may be performed at a relatively high temperature (for example, between 800° C. and 1200° C.).

The bottom electrode layer 205, in some implementations, includes one or more oxidation resistant, conductive materials: such as Pt, Pd, Ir, or a combination thereof. In some implementations, the bottom electrode layer 205 is made of Pt. The bottom electrode layer 205 is between 10 nanometers and 30 nanometers thick, in some implementations.

In some implementations, the bottom electrode layer 205 includes a Ti layer and a Pt layer (Ti/Pt); the Ti layer is formed between the Pt layer and the substrate 201. In some other implementations, the bottom electrode layer 205 includes a Ti layer and a Pd layer (Ti/Pd); the Ti layer is formed between the substrate layer 201 and the Pt layer. In still some other implementations, the bottom electrode layer 205 includes a Ti/(Pt, Pd) layer, where (Pt, Pd) is an alloy from Pt and Pd. The Ti layer may be used to increase adhesion between Pt and the substrate 201 (or between Pt and the thermal oxide layer 203).

The mask layer 231, in some implementations, includes a low temperature oxide material, such as Plasma-Enhanced Chemical Vapor Deposition (PECVD) $SiO_2$. The PECVD SiO2 may be formed at a relatively low temperature (for example, between 200° C. and 400° C.). It is noted that the differences between the thermal oxide layer 203 (e.g., the thermal $SiO_2$ layer) and the mask layer 231 (e.g., the PECVD $SiO_2$) may include not only their growth temperatures, but also their physical properties such as densities. In some implementations, the density of the thermal oxide layer 203 is greater than that of the mask layer 231.

Figure 2D:
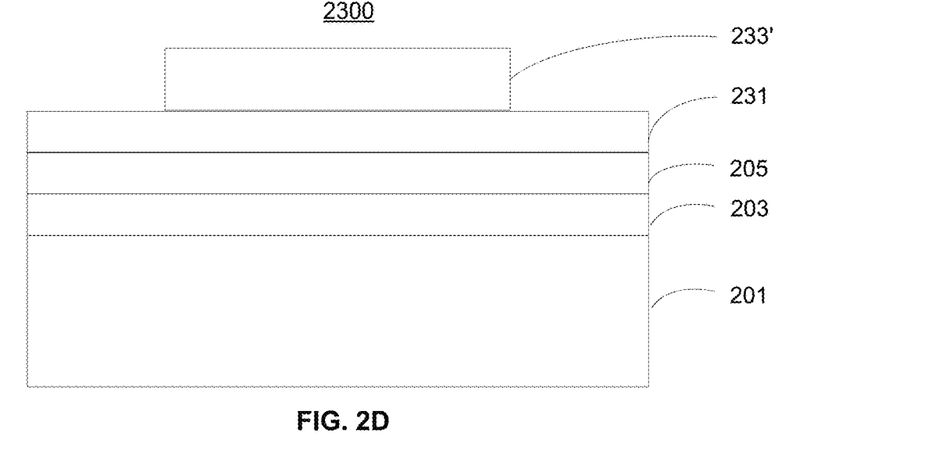
Figure 2E:
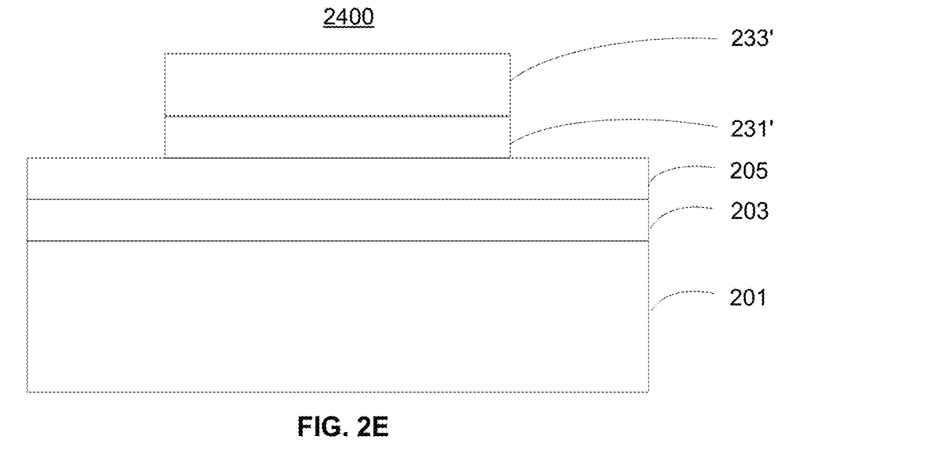

Next, as shown in FIG. 2D, the photo resist layer 233 is patterned using photolithography to produce a patterned photo resist layer 233'. The patterned photo resistant layer 233' is patterned substantially to the shape of the bottom electrode. And then, as shown in FIG. 2E, the mask layer 231 is patterned such as etched using a Reactive-Ion Etching (RIE) process via the patterned photo resist layer 233' to form a patterned mask layer 231'.

Figure 2F:
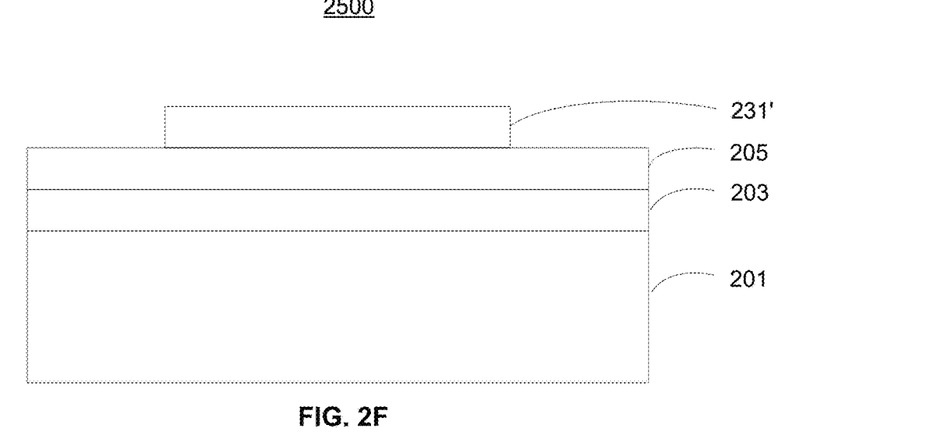

Further, as shown in FIG. 2F, the patterned photo resist layer 233' may be removed using a lift-off process; the patterned mask layer 231' may be exposed for use as a mask for etching the bottom electrode layer 205.

Figure 2G:
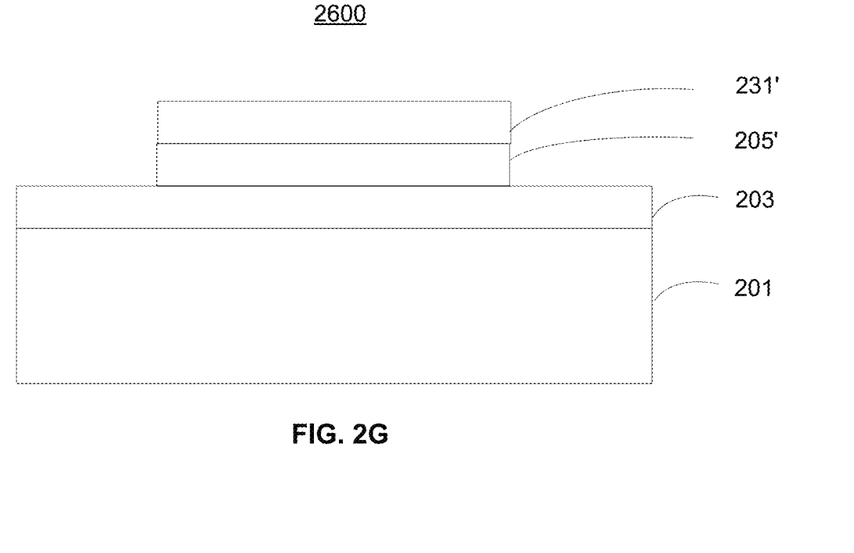
Figure 2H:
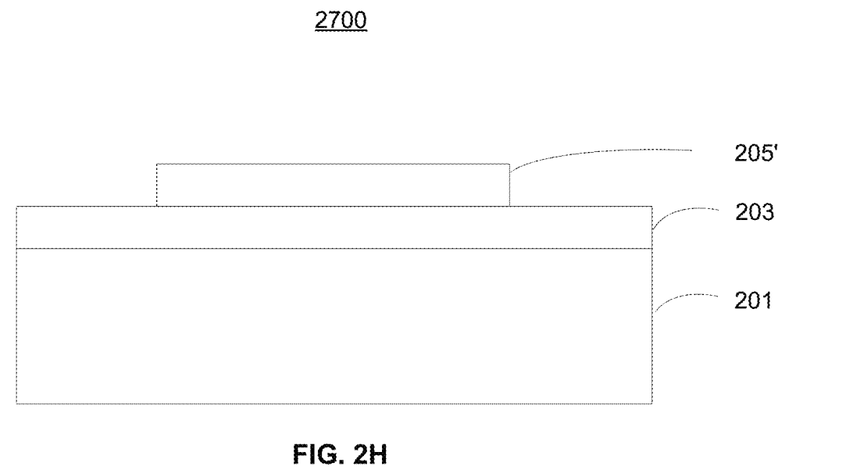

FIGS. 2G-2H illustrate an example process for etching an oxidation resistant electrode (e.g., the bottom electrode 205) in accordance with some implementations of the present disclosure. Conventional wet etch techniques may have difficulties etching Pt or other oxidation resistant electrode, because Pt has a high chemical inertness. Also, undercutting sidewalls may limit the scale down on feature sizes (e.g., aqua regia HCl:HNO3=3:1 is a strong acid that may dissolve noble metals such as Au, Pt, and Pd, but the isotropic nature limits the scaling down of its feature size). Meanwhile, dry etch techniques (e.g., a RIE process) may have difficulties etching Pt or other oxidation resistant electrode, because Pt may produce non-gaseous reaction products. The example process for etching an oxidation resistant electrode as shown in these figures can address these issues.

Figure 6:
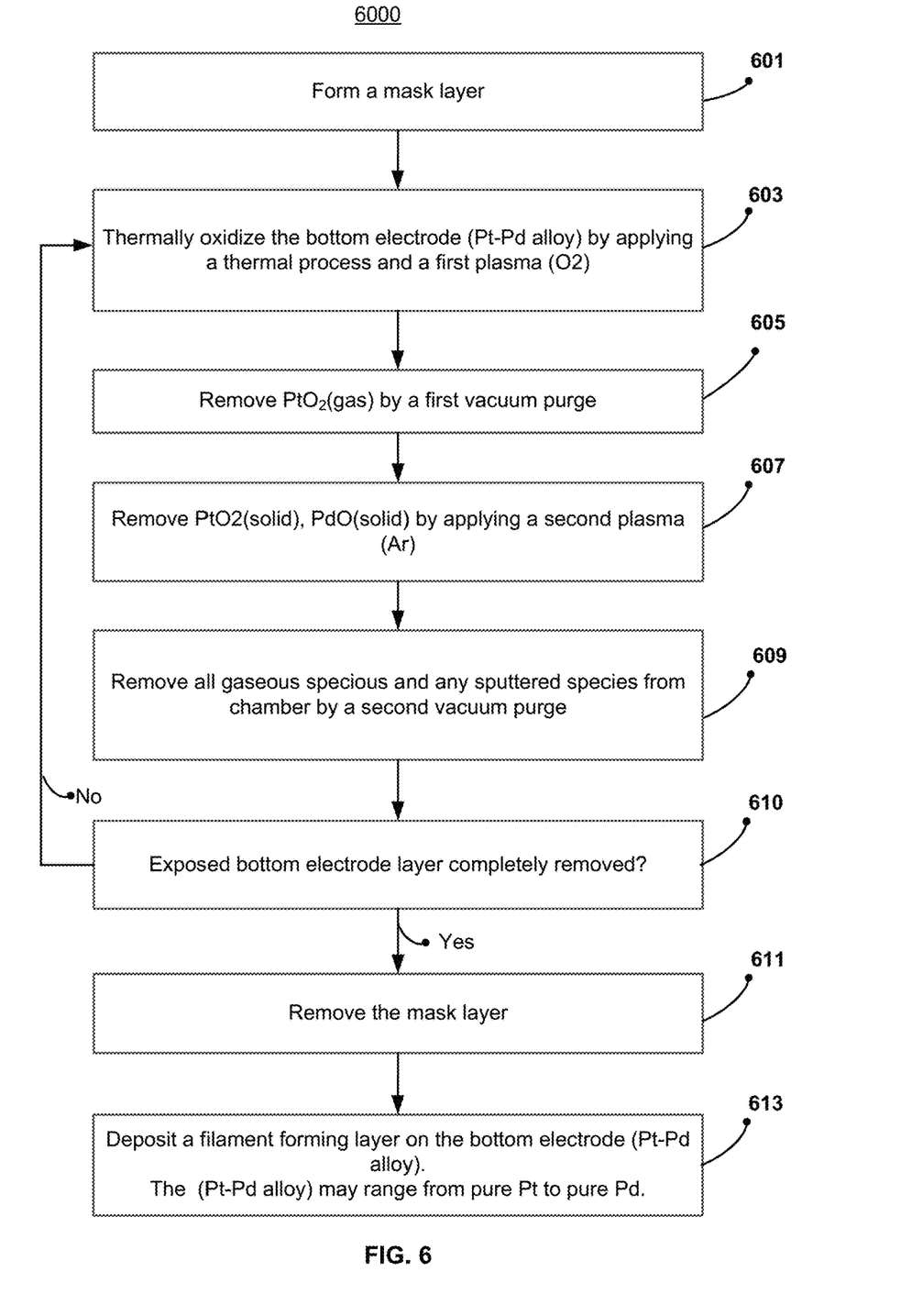
FIG. 6 is a flowchart illustrating an example process for etching one or more oxidation resist electrodes in accordance with some implementations of the present disclosure.

FIG. 6 is a flowchart 6000 illustrating an example process for etching one or more oxidation resist electrodes in accordance with some implementations of the present disclosure.

After the patterned mask layer 231' is formed on the bottom electrode layer 205 (step 601), as shown in FIG. 2F, the bottom electrode layer 205 may be thermally oxidized by applying heat (a thermal process) and a first plasma (e.g., an oxygen plasma) via the patterned mask layer 231' (step 403).

Figure 3:
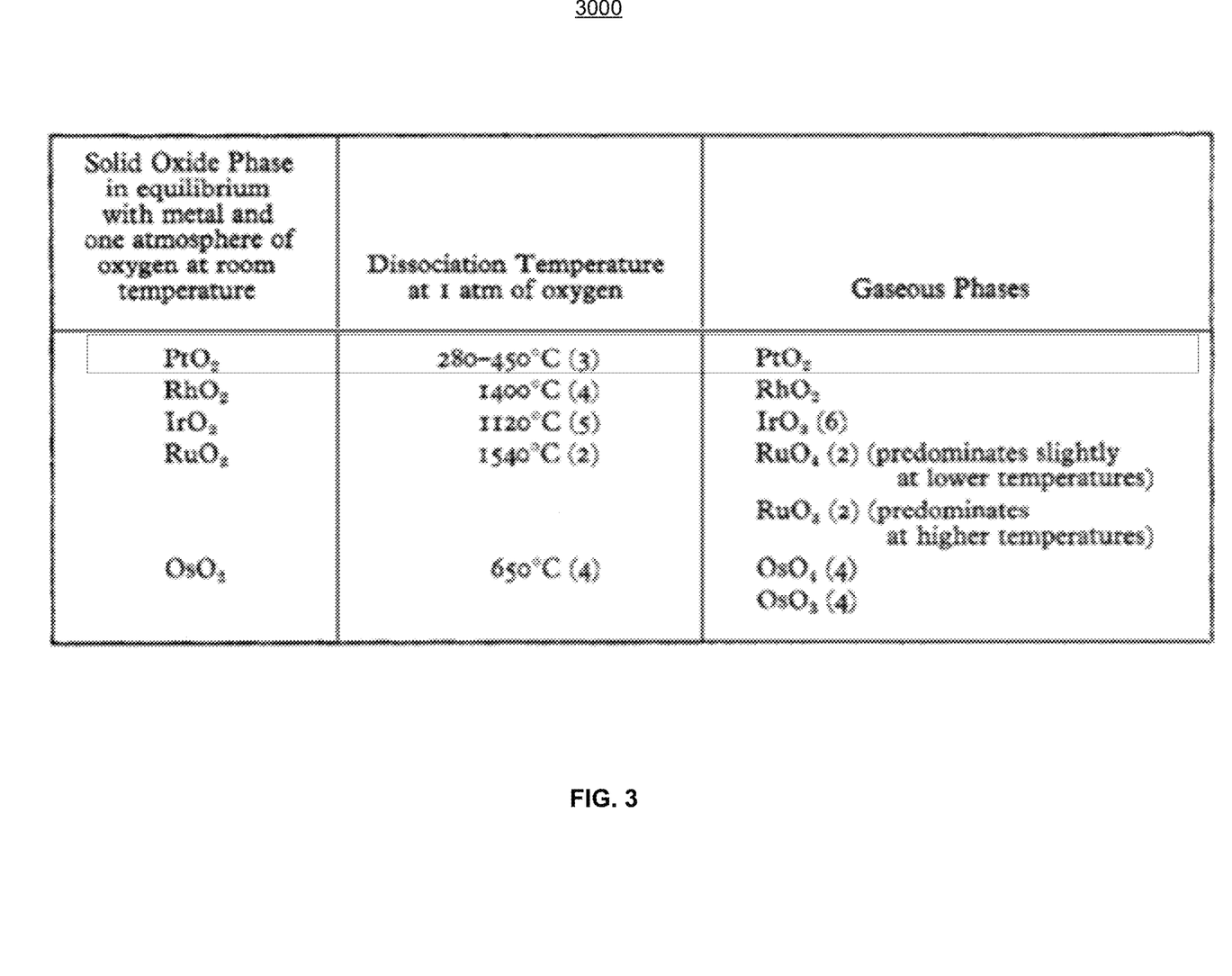
FIG. 3 is a data table illustrating solid oxide phases in equilibrium with different metals and one atmosphere of oxygen at room temperature in accordance with some implementations of the present disclosure.

According to the data shown in FIG. 3, a solid $PtO_2$ is in equilibrium with Pt with 1 atm $O_2$ at room temperature, and a gaseous $PtO_2$ may be formed at between 280° C. and 450° C. at 1 atm of $O_2$. Therefore, in some implementations, the thermal oxidation of the bottom electrode layer 205 may be processed under oxygen plasma at between 350° C. and 450° C.

Figure 4:
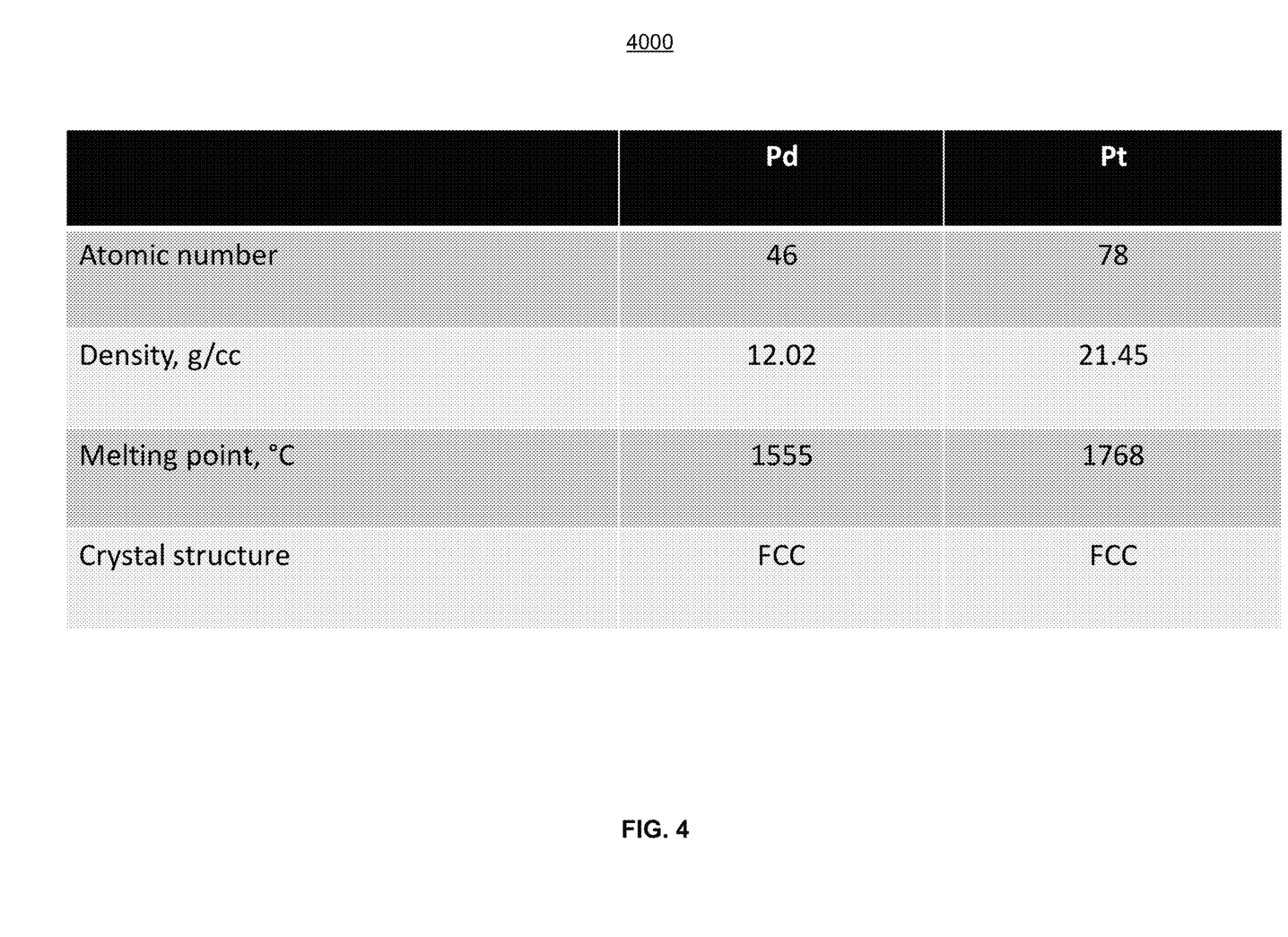
FIG. 4 is a data table illustrating various characteristics of Pd and Pt in accordance with some implementations of the present disclosure.
Figure 5:
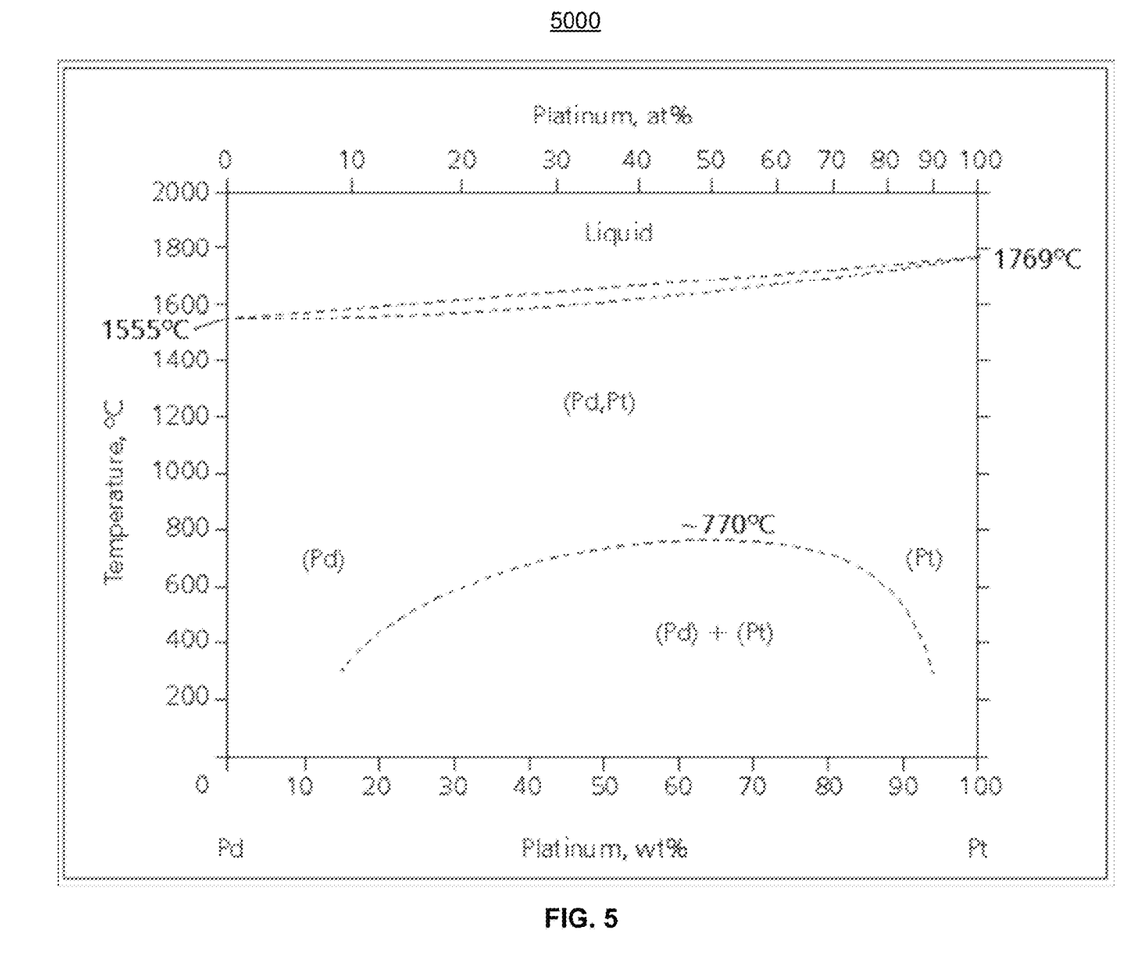
FIG. 5 is a phase equilibrium diagram illustrating various phases of Pt, Pd, and Pt—Pd alloy.

Also, according to the data shown in FIG. 4, various characteristics of Pd and Pt show that Pd and Pt are from the same group in periodic table. Furthermore, Pd and Pt share the same crystal structure FCC (Face Centered Cubic), as shown in FIG. 4, and may form continuous solid solution from pure Pd to pure Pt, as shown in FIG. 5. Furthermore, because Pd and Pt are both oxidation resistant, they are both difficult to pattern. Pd, Pt, or a (Pt, Pd) alloy may be patterned using the example processes described in the present disclosure.

By increasing the temperature of the bottom electrode layer 205 (e.g., a Pt bottom electrode), the Pt oxidation rate may be increased and the phase change rate from solid $PtO_2$ to gaseous $PtO_2$ may also be increased. The oxygen plasma may also increase the Pt oxidation rate. The combination of thermal and oxygen plasma increases the Pt oxidation rate, and increases the phase change rate from $PtO_2$ (s) to $PtO_2$ (g).

Next, the gaseous $PtO_2$ may be removed using a first vacuum purge from chamber (step 605). Because the substrate is under heat, the phase change from solid $PtO_2$ to gaseous PtO2 is continued, and the removal of gaseous $PtO_2$ is continued.

Next, the solid $PtO_2$ may be removed by applying a second plasma (e.g., an argon plasma) via the patterned mask layer 231' (step 607). In this stage, the argon plasma is used to remove solid $PtO_2$ from the surface of exposed bottom electrode layer 205. In some implementations, increasing the RF power and the argon flow may also increase the rate at which solid $PtO_2$ is etched.

Using the patterned mask layer (e.g., a PECVD $SiO_2$ layer) 231' as an oxidation mask may provide excellent thermal and chemical stability under the thermal oxygen plasma and the argon plasma. Also, using the PECVD $SiO_2$ layer 231' as an oxidation mask may produce a clean surface of the patterned bottom electrode 205', after an RIE process. A clean surface of the patterned bottom electrode 205' may provide good contact stability with the filament forming layer formed as described above.

Next, all gaseous species and sputtered species may be removed from the chamber by a second vacuum purge (step 609); a patterned bottom electrode 205' as shown in FIG. 2G may be formed thereafter. The patterned mask layer 231' (step 611) is then removed, exposing the patterned bottom electrode 205', as shown in FIG. 2H.

It should be pointed out that step 603 to step 609 forms one processing cycle to remove or etch away a fraction of exposed bottom electrode layer 205. One or more iterations of steps between the step 603 and the step 609 may be applied to completely or substantially remove or etch away exposed bottom electrode layer 205.

Figure 2I:
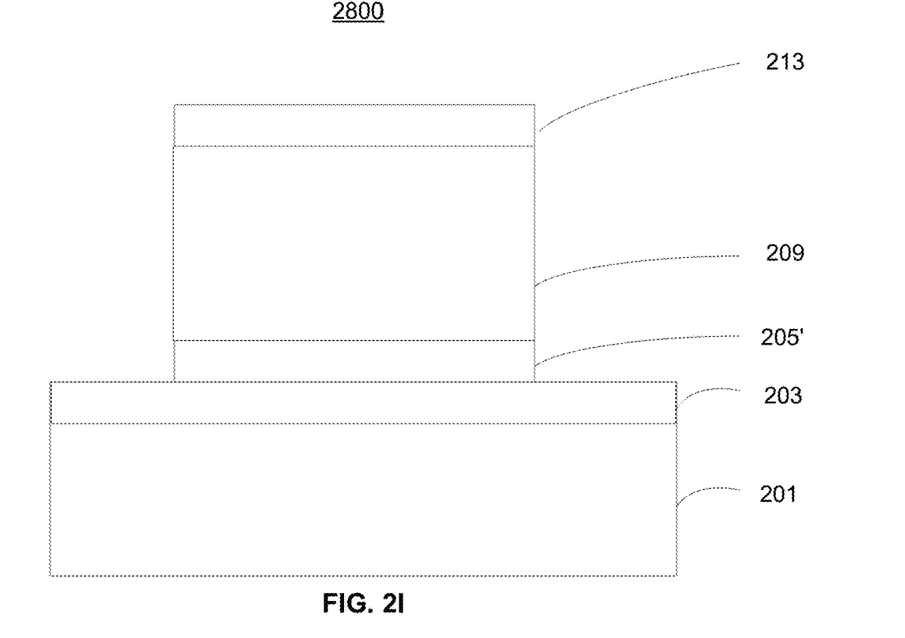

Further, as shown in FIG. 2I, a filament forming layer 209 is formed on the patterned bottom electrode 205', and a top electrode 213 is formed on the filament forming layer 209 as shown in FIG. 2I.

In some implementations, the top electrode 213 may be formed by the same process for forming the bottom electrode 205, which may include the process of etching an oxidation resistant electrode as explained with reference to FIG. 6.

Figure 2J:
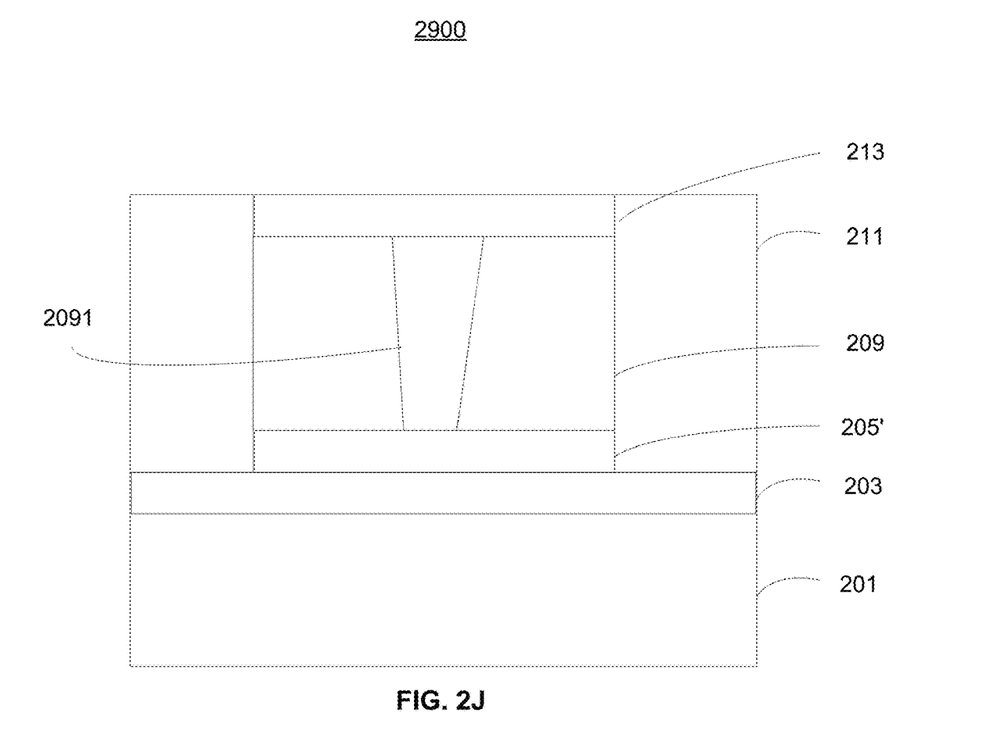

Moreover, as shown in FIG. 2J, a passivation layer 211 may be formed on a sidewall of the patterned bottom electrode 205', a sidewall of the filament forming layer 209, and a sidewall of the top electrode 213 for the purpose of sidewall protection or cell isolation.

In some implementations, the filament forming layer 209 is configured to form a filament 2091 within the filament forming layer 209, responsive to a switching voltage being applied to the filament forming layer 209.

The filament forming layer 209 is, in some implementations, made of the following materials: $TaO_x$ (where x≤2.5), $HfO_x$ (where x≤2.0), $TiO_x$ (where x≤2.0), $ZrO_x$ (where x≤2.0), or a combination thereof.

The top electrode 213 is, in some implementations, made of the following materials: Pt, Ti, TiN, Pd, Ir, W, Ta, Hf, Nb, V, TaN, NbN, a combination thereof, or an alloy thereof with any other conductive materials. The bottom electrode 205 is, in some implementations, made of the following materials: Pt, Ti, TiN, Pd, Ir, W, Ta, Hf, Nb, V, TaN, NbN, a combination thereof, or an alloy thereof with any other conductive materials.

In some implementations, the bottom electrode 205 is connected to the first column wire 102, and the top electrode 213 is connected to a first row wire 101.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation (s).

It will also be understood that, although the terms "first," "second," etc. may be used herein to describe various elements, these elements should not be limited by these terms. These terms are only used to distinguish one element from another. For example, a first column could be termed a second column, and, similarly, a second column could be termed the first column, without changing the meaning of the description, so long as all occurrences of the "first column" are renamed consistently and all occurrences of the "second column" are renamed consistently. The first column and the second are columns both column s, but they are not the same column.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures, and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. A method of manufacturing an RRAM-based crossbar array circuit comprising:
   providing a substrate;
   forming a bottom electrode layer on the substrate;
   forming a patterned mask layer on the bottom electrode layer;
   thermal oxidizing a surface of the bottom electrode layer via the patterned mask layer by applying a thermal process and a first plasma to form a bottom electrode oxide;
   removing a gaseous status of the bottom electrode oxide by a first vacuum purge;
   removing a solid status of the bottom electrode oxide by applying a second plasma;
   removing the gaseous status of the bottom electrode oxide and the solid status of the bottom electrode oxide by a second vacuum purge to form a patterned bottom electrode;
   removing the patterned mask layer;
   forming a filament forming layer on the patterned bottom electrode; and
   forming a top electrode on the filament forming layer, wherein the filament forming layer is configured to form a filament within the filament forming layer when applying a switching voltage upon the filament forming layer,
   wherein a material of the bottom electrode layer comprises Pd, and
   wherein a material of the filament forming layer comprises $TaO_x$ (where $x \leq 2.5$), $HfO_x$ (where $x \leq 2$), $TiO_x$ (where $x \leq 2$), $ZrO_x$ (where $x \leq 2$), or a combination thereof.

2. The method as claimed in claim 1, wherein the first plasma comprises an oxygen plasma.

3. The method as claimed in claim 1, wherein the second plasma comprises an argon plasma.

4. The method as claimed in claim 1, wherein the thermal process comprises heating under a temperature between 350° C. and 450° C.

5. The method as claimed in claim 1, wherein the substrate is made of a material selected from Si, $SiO_2$, $Si_3N_4$, $Al_2O_3$, AlN, or glass.

6. The method as claimed in claim 1, wherein a material of the bottom electrode layer comprises Pd/Pt alloy, Pd/Ir alloy, or a combination thereof.

7. The method as claimed in claim 1, wherein the bottom electrode layer is made of a material selected from a Ti/Pd layer, or a Ti/(Pt, Pd) layer.

8. The method as claim 1, wherein a thickness of the bottom electrode layer is between 10 nanometers and 30 nanometers.

9. The method as claimed in claim 1, wherein a material of the top electrode comprises Pd, Pt, Ir, W, Ta, Hf Nb, V, Ti, TiN, TaN, NbN, a combination thereof or an alloy with any other conductive materials thereof.

10. The method as claimed in claim 1, further comprises:
    forming an inter-layer dielectric layer or a thermal oxide layer on the substrate before forming the bottom electrode layer on the substrate, wherein a material of the thermal oxide layer comprises $SiO_2$.

11. The method as claimed in claim 1, wherein forming a patterned mask layer on the bottom electrode layer comprises:
    forming a mask layer on the bottom electrode layer;
    forming a photo resist layer on the mask layer;
    patterning the photo resist layer to be a patterned photo resist layer;
    etching the mask layer by reactive-ion etching or ion-etch via the patterned photo resist layer to form the patterned mask layer; and
    removing the patterned photo resist layer.

12. The method as claimed in claim 11, wherein a material of the mask layer comprises $SiO_2$.

13. The method as claimed in claim 12, wherein a density of the mask layer is lower than that of the thermal oxide layer.

14. The method as claimed in claim 1, further comprises:
    connecting the patterned bottom electrode to a first row wire; and connecting the top electrode to a first column wire.

* * * * *

UNITED STATES PATENT AND TRADEMARK OFFICE
CERTIFICATE OF CORRECTION

| | |
|---|---|
| PATENT NO. | : 11,177,438 B2 |
| APPLICATION NO. | : 16/421166 |
| DATED | : November 16, 2021 |
| INVENTOR(S) | : Zhang et al. |

It is certified that error appears in the above-identified patent and that said Letters Patent is hereby corrected as shown below:

On the Title Page

Item [73], Delete "Tetramen Inc." and insert --TetraMem Inc.--

Signed and Sealed this
Thirteenth Day of December, 2022

Katherine Kelly Vidal
*Director of the United States Patent and Trademark Office*